United States Patent [19]

Maida

[11] Patent Number: 4,553,140
[45] Date of Patent: Nov. 12, 1985

[54] POWER SUPPLY CONTROL CIRCUIT

[75] Inventor: Osamu Maida, Tokyo, Japan

[73] Assignee: Nippon Kogaku K. K., Tokyo, Japan

[21] Appl. No.: 449,427

[22] Filed: Dec. 13, 1982

[51] Int. Cl.$^4$ ............................................. G08B 21/00
[52] U.S. Cl. .................................... 340/636; 354/468;
354/473; 354/484
[58] Field of Search ..................... 340/636; 320/13, 37, 320/38, 48; 354/465, 466, 467, 468, 469, 470, 471, 472, 473, 474, 475, 484, 289.1, 289.12

[56] References Cited
U.S. PATENT DOCUMENTS
4,471,492  9/1984  Mann et al. ...................... 340/636 X Primary Examiner—James L. Rowland
Assistant Examiner—Daniel Myer
Attorney, Agent, or Firm—Shapiro and Shapiro

[57] ABSTRACT

A power supply control circuit for controlling power supply through a power switch to a battery-operated circuit. The control circuit includes circuitry for keeping the power supply to the battery-operated circuit for a predetermined holding time after the power switch has been turned off, the holding time being reduced as consumption of the battery develops.

7 Claims, 6 Drawing Figures

POWER SUPPLY CONTROL CIRCUIT

BACKGROUND OF THE INVENTION

1. Field of the Invention

The present invention relates to a power supply control device including circuitry for holding the power supply from a battery to a battery-operated circuit for a certain time period after a power switch is turned off.

2. Description of the Prior Art

Conventionally, a camera exposure meter circuit, automatic exposure control circuit or the like is provided with circuitry for supplying power switch on in response to the shutter buttom operation at its half-depression position, which is shallower than the stroke where the shutter release takes place and for maintaining or holding the power supply operative to supply power for a certain time period even if an operator releases his finger from the shutter button to facilitate camera handling.

In a camera with such circuitry, an operator can view the exposing condition or exposure control status for a certain time period after releasing his finger from the shutter button. In such conventional power supply holding circuits, however, the power supply holding time is set as a constant value even where a battery is weak or depleted. This kind of circuit with a power supply holding function, which is directed only to the purpose of facilitating camera handling, and is not necessarily required to take a photograph, has a disadvantage in that consumption of a batter is hastened.

SUMMARY OF THE INVENTION

Accordingly, it is an object of the invention to provide an improved power supply control circuit in which the power supply holding time is reduced as the voltage of a power source decreases to prevent the battery from being wasted.

The foregoing object and other objects are accomplished according to the present invention in a power supply control circuit for controlling power supply to a battery-operated circuit, the control circuit comprising a circuit for starting time-measuring upon a manual operation and producing a time-measuring signal for a predetermined time period from the starting time, a circuit for holding the power supply operative to supply power while the time-measuring signal is being produced, and a circuit for detecting the battery voltage and reducing the predetermined time period to be time-measured in the time-measuring circuit as the battery voltage goes down.

BRIEF DESCRIPTION OF THE DRAWINGS

The invention will be more fully understood from the following detailed description taken in conjunction with the accompanying drawings, in which.

DETAILED DESCRIPTION OF THE EMBODIMENTS

First Embodiment

Figure 1:
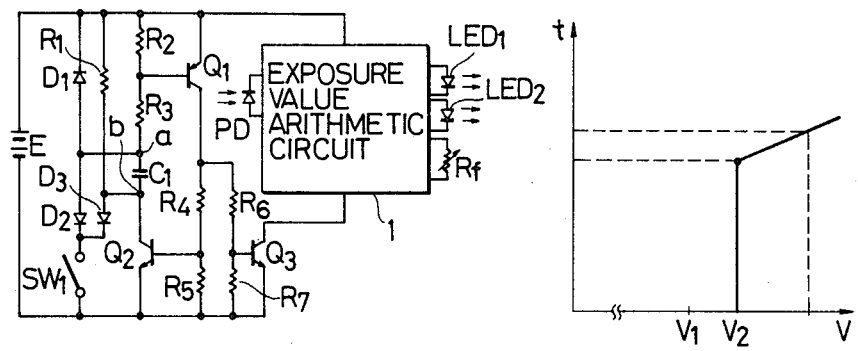
FIG. 1 is a circuit diagram of a first embodiment of power supply control circuit according to the present invention.

A first embodiment of power supply control circuit in accordance with the invention is shown in FIG. 1. Battery E supplies exposure value arithmetic circuit 1 with power upon the closure of power switch $SW_1$. In an exposure meter, power switch $SW_1$ is closed through the depression operation on a push button provided therein and opened through the release from the push button. In a camera including an exposure metering circuit, the power switch is closed in response to the half-depression operation on a shutter button and opened through the release operation from the shutter button. Resistors $R_2$, $R_3$, $R_4$ and $R_5$, capacitor $C_1$ and transistors $Q_1$ and $Q_2$ constitute a power supply holding circuit. Exposure arithmetic circuit 1 receives as input information a subject brightness detected through photodiode PD, film sensitivity, shutter speed and aperture value respectively determined by setting variable resistor $R_f$ and evaluates them as to whether they meet a proper exposure condition. The evaluation result is displayed on light emission diodes $LED_1$ and $LED_2$ in a predetermined mode. Transistor $Q_3$ which serves to control the power supply to arithmetic circuit 1, is biased by means of resistors $R_6$ and $R_7$ so as to be turned off when a power supply voltage V to arithmetic circuit 1 falls to a lower limit voltage $V_1$ for arithmetic circuit 1. And also, resistors $R_4$ and $R_5$ are arranged so that a voltage slightly higher than the lower limit voltage $V_1$ becomes the critical voltage for ON or OFF state in transistor $Q_2$. The working of the circuit will be explained in three cases of battery consumption condition. In the explanation, V is a voltage of the battery, $V_1$ a lower limit voltage which assures the proper operation of arithmetic circuit 1 as a line voltage and $V_2$ a voltage higher than $V_1$ which does not fall to lower limit voltage $V_1$ during the power supply holding time period (in other words, $V_2$ is a voltage which assures that arithmetic circuit 1 can normally operate for the power supply holding time period.).

$$V > V_2$$

In this case of battery condition, battery E has a sufficient or adequate voltage. As power switch $SW_1$ is closed, the voltage developed on resistors $R_2$ and $R_3$ biases transistor $Q_1$ to its ON state. The collector current of transistor $Q_1$ flows through resistors $R_4$ and $R_5$ and develops a bias voltage which causes transistors $Q_2$ and $Q_3$ to be turned ON. Transistors $Q_1$ and $Q_2$ constitute a positive feedback circuit. In this embodiment, during the period while the voltage across capacitor $C_1$ remains small, after power switch $SW_1$ has been opened, the above-mentioned positive feedback operation keeps transistor $Q_1$ in its ON state. While power switch $SW_1$ remains closed, the potential at one terminal a of capacitor $C_1$ can not rise over the forward voltage of diode $D_2$ because terminal a is clamped to ground through diode $D_2$ and power switch $SW_1$. Accordingly, the bias voltage which causes transistor $Q_1$ to be turned ON is unchanged. The conduction path of transistor $Q_3$ in its ON state forms a power supply line to arithmetic circuit 1 as long as power switch $SW_1$ is closed. Thereafter, when power switch $SW_1$ is opened, the clamping for terminal a is released. The collector current of transistor $Q_2$ charges capacitor $C_1$ and the potential of terminal a gradually rises to the level which can turn transistor $Q_1$ off, after a predetermined time period. When transistor $Q_1$ is turned OFF, the bias voltage which causes transistor $Q_3$ to be turned on is lost and the power line to arithmetic circuit 1 is disconnected. The rising potential at terminal a is a function of time constant determined by capacitor $C_1$ and resistors $R_2$ and $R_3$. During a time period from the opening of power switch $SW_1$ to the time when the potential at terminal a rises to the level which turns transistor $Q_1$ off, transistors $Q_1$ and $Q_3$ remain ON and continue supplying arithmetic circuit 1 with power to work an exposure meter. The time required to charge capacitor $C_1$ determines the power supply holding time period. In this embodiment, holding time measurement starts with the opening of power switch $SW_1$. Alternatively, it is possible to constitute a circuit in which the time measurement starts with the closure of switch $SW_1$.

$$V_2 > V > V_1$$

In this case of battery condition, the voltage V of battery E is nearly equal to the lower limit voltage $V_1$. The closure of power switch $SW_1$ turns transistor $Q_1$ on. With transistor $Q_1$ in its ON state, the collector current of transistor $Q_1$ which flows through resistors $R_4$–$R_7$ develops bias voltages for transistors $Q_2$ and $Q_3$. As battery voltage V is higher than $V_1$ but lower than $V_2$, transistor $Q_3$ is turned on and supplies power to arithmetic circuit 1, while transistor $Q_2$ can not be turned on. While transistor $Q_2$ is in its OFF state, there is no potential difference between terminals a and b of capacitor $C_1$ because both terminals are clamped through power switch $SW_1$ to ground (through diodes $D_2$ and $D_3$, respectively). That is, capacitor $C_1$ is not charged in a reverse polarity through discharging resistor $R_1$ described later. Thus, polarized capacitors like tantalum electrolytic capaccitors and aluminum electrolytic capacitors are available for capacitor $C_1$. Now, power switch $SW_1$ is opened. At this time, capacitor $C_1$ is not charged through transistor $Q_2$ because transistor $Q_2$ is in its OFF state. The potential at terminal a immediately rises to the level which turns transistor $Q_1$ off and in turn transistor $Q_3$ off to cut off the power supply to arithmetic circuit 1. Accordingly, a user notices through the off-light state of display elements $LED_1$ and $LED_2$ in arithmetic circuit 1 that the exposure meter has stopped its operation just after power switch $SW_1$ was opened and is thus informed that the battery has been consumed to the condition where the battery voltage V will soon fall to lower limit voltage $V_1$. Even in this situation, if the operator closes power switch $SW_1$, the exposure metering circuit will be able to operate.

$$V_1 > V$$

When power switch $SW_1$ is closed, transistors $Q_2$ and $Q_3$ can not be turned ON, though transistor $Q_1$ can be ON. That is, the power to arithmetic circuit 1 can not be supplied. At this status, display elements $LED_1$ and $LED_2$ remain unlighted and the operator learns that battery E has been consumed or exhausted to an un-usable condition. Naturally, even immediately after power switch $SW_1$ has been opened, transistor $Q_3$ is not turned on.

Figure 2:
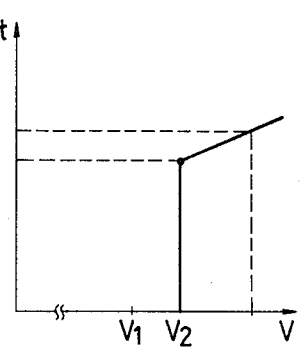
FIG. 2 is a plot of power supply holding time versus battery voltage in the circuit of FIG. 1.

The operating characteristic of the circuit of FIG. 1 is shown in FIG. 2. The variable on the vertical axis is a power supply holding time t time-measured from the opening of power switch $SW_1$ and the variable on the horizontal axis a battery voltage V. When $V > V_2$, holding time t is continuously reduced as the battery voltage goes down. This is because the charging current through resistor $R_2$ which biases transistor $Q_1$ becomes small more rapidly in a lower battery voltage.

Second Embodiment

Figure 3:
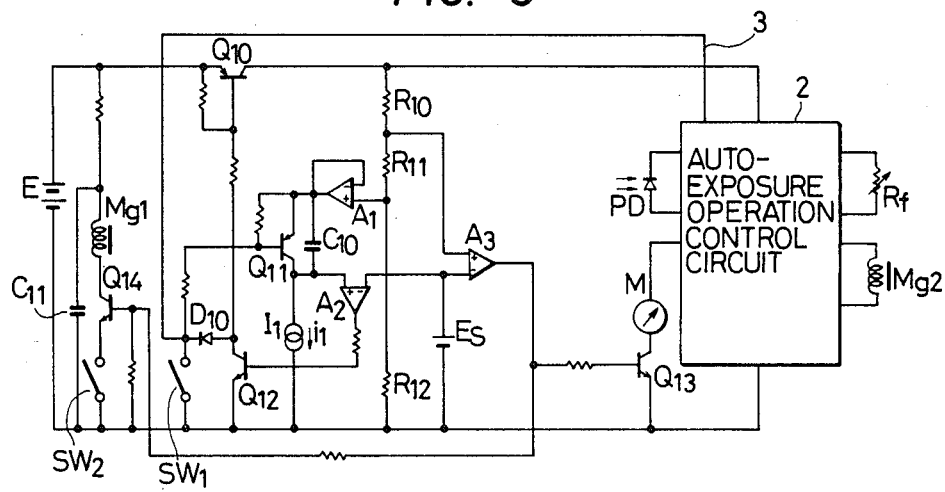
FIG. 3 is a circuit diagram of a second embodiment of power supply control circuit according to the present invention.

A second embodiment of power supply control circuit in accordance with the invention is presented in FIG. 3. In this embodiment, as compared with the circuit of FIG. 1, the change of holding time t when battery voltage V is higher than $V_2$ is so emphasized that a user may learn the change of battery voltage in the range higher than $V_2$ from the change of holding time. This embodiment is designed as an exposure control circuit in a magnetic release system. For clarity, those elements in this embodiment which are functionally the same as those of FIG. 1 are identified by the same reference characters. Power switch $SW_1$ and switch $SW_2$ operate serially. As a shutter button is depressed in a half stroke, power switch $SW_1$ is closed. And further depression on the shutter button brings the closure of switch $SW_2$ which causes the magnetic release mechanism to work for taking photograph. The operation of the second embodiment is as follows.

When battery E has a sufficient or adequate voltage, the closure of power switch $SW_1$, which is brought by the half-depression on the shutter button, turns on transistor $Q_{10}$ through reverse current blocking diode $D_{10}$. Through the conduction path of transistor $Q_{10}$ in its ON state, auto-exposure control circuit 2 is supplied with power. Auto-exposure control circuit 2 receives as input information a subject brightness detected by photodiode PD, film sensitivity value and aperture value respectively determined by setting variable resistor $R_f$ and arithmetically evaluate them to display a proper shutter speed value on meter M and also, when the magnetic release mechanism is operated, to control a shutter (not shown) at the proper shutter speed through shutter control magnet $Mg_2$. The line voltage is divided in serially connected resistors $R_{10}$, $R_{11}$ and $R_{12}$. An output voltage $V_{A1}$ of voltage follow amplifier $A_1$ is represented as $$V_{A1} = V \frac{R_{12}}{R_{10} + R_{11} + R_{12}} = V \cdot K_1$$

where $K_1$ is constant. The closure of power switch $SW_1$ also turns transistor $Q_{11}$ on. With transistor $Q_{11}$ in its ON state, capacitor $C_{10}$ is shorted and thus not charged. Voltage source ES produces a constant voltage like a zener diode or band-gap regulator which works when transistor $Q_{10}$ is in its ON state. Current source $I_1$ is a current sink source which provides charge current $i_1$ to capacitor $C_{10}$ when transistor $Q_{11}$ is in its OFF state, as described later. When transistor $Q_{11}$ is turned on through the closure of switch $SW_1$, the voltage at non-inverting input+ of comparator $A_2$ is made equal to the output voltage $V_{A1}$ of follower amplifier $A_1$, that is V.K. In this context, the sufficient battery voltage means that the output voltage $V_{A1} = V.K_1$ of follower amplifier $A_1$ is higher than the voltage $V_{ES}$ of constant voltage sourse ES. Thus, comparator $A_2$ produces its high level output which causes transistor $Q_{12}$ to be turned on. As a result, the circuit has a positive feedback function which allows transistor $Q_{10}$ to remain in its ON state even after power switch $SW_1$ has been opened. A voltage $V_{A3in}$ which is derived by dividing the line voltage V through resistors $R_{10}$, $R_{11}$ and $R_{12}$ is applied to non-inverting input+ of comparator $A_3$. The voltage $V_{A3in}$ is represented as $$V_{A3in} = V \frac{R_{11} + R_{12}}{R_{10} + R_{11} + R_{12}} = V \cdot K_2$$

where $K_2$ is constant. It will be easily understood that $K_2 > K_1$. Thus, the input voltages of comparators $A_1$ and $A_3$ are in a relation of $V_{A3in} > V_{A1}$.

When the battery possesses a voltage sufficient to exhibit the relation of $V \cdot K_2 > V_{ES}$, comparator $A_3$ produces a high level which causes transistor $Q_{13}$ to be turned on. Through the conduction path of transistor $Q_{13}$ in its ON state, shutter speed meter M can indicate a controlled shutter speed value. At this state, further depression on the shutter button closes switch $SW_2$. The high level output of comparator $A_3$ turns transistor $Q_{14}$ on. The charge in capacitor $C_{11}$ which has been accumulated through a resistor by the line voltage discharges as a current for magnetizing magnet $Mg_1$ to actuate a magnet release mechanism (not shown) which conducts a photograph taking sequence. Once the photograph taking sequence starts, transistors $Q_{10}$ and $Q_{11}$ are adapted to keep their ON state through line 3. That is, even if power switch $SW_1$ is opened during the photograph taking sequence, the same condition as when the power switch is closed is secured until the completion of exposure. Thereafter, when power switch $SW_1$ is opened, while transistor $Q_{11}$ is turned off, transistor $Q_{10}$ continues its ON state because of the positive feedback function through transistor $Q_{12}$ in its ON state. As transistor $Q_{11}$ is turned off, capacitor $C_{10}$ which has so far been shorted by transistor $Q_{11}$ in ON state is charged by constant current sink sourse $I_1$. When a voltage at non-inverting input+ of comparator $A_2$ drops below the voltage $V_{ES}$ of constant voltage source $E_S$ which is applied to inverting input− of comparator $A_2$, the output of comparator $A_2$ becomes a low level which places transistor $Q_{12}$ in its OFF state. As a result, the positive feedback function is lost and then transistor $Q_{10}$ is turned off so that the power supply line to exposure control circuit 2 is broken. That is, the power supply holding time is determined by the charging time in capacitor $C_{10}$. The interval t from the opening of power switch $SW_1$ to the time when transistor $Q_{10}$ is turned off has the following relation with voltage V of battery E.

$$t = \frac{C_{10}}{i_1} \{V \cdot K_1 - V_{ES}\}$$

Where battery voltage V goes down to the level in which $V \cdot K_1 \leq V_{ES}$ (that is $V \leq V_{ES}/K_1$), power supply holding time t becomes zero.

Where $V_{ES}/K_2 < V < V_{ES}/K_1$, the holding time t is zero, while the power supply to exposure control circuit 2 can be conducted as long as power switch $SW_1$ is closed because the output voltage of comparator $A_3$ is a high level in the relation of $V \cdot K_2 > V_{ES}$. Accordingly, the user can learn that the battery is still usable but will be soon consumed to an unusable level.

Where $V < V_{ES}/V_2$, the output voltage of comparator $A_3$ is a low level which places transistor $Q_{13}$ in its OFF state and thus meter M does not work. The user knows from the status of meter M that battery E has been exhausted to an unusable condition. As another aspect, even if the user erroneously depresses the shutter button to a position where shutter release takes place and turns switch $SW_2$ on, magnet $Mg_1$ does not start the photograph taking sequence of the camera because transistor $Q_{14}$ is in its OFF state.

Figure 4:
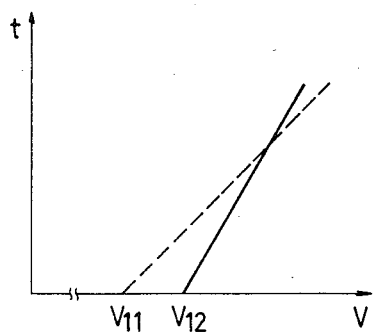
FIG. 4 is a plot of a power supply holding time versus battery voltage in the circuit of FIG. 3.

FIG. 4 shows a solid line the relation between voltage V of battery E and power supply holding time t during which transistor $Q_{10}$ maintains its ON state after power switch $SW_1$ is opened. $V_{12}$ is a voltage at a point of $V = V_{ES}/K_1$ where the holding time is zero. $V_{11}$ is a voltage at a point of $V = V_{ES}/K_2$ where meter M does not work upon the closure of power switch $SW_1$ because the output of comparator $A_3$ is a low level, and the photographing sequence does not start even if switch $SW_2$ is closed. With the resistance value of resistor $R_{11}$ reduced to zero so that $K_1 = K_2$, it is possible to make the release function inoperative at a point where the holding time is zero. The characteristic in such an operation is shown as a dash line in FIG. 4.

Third Embodiment

Figure 5:
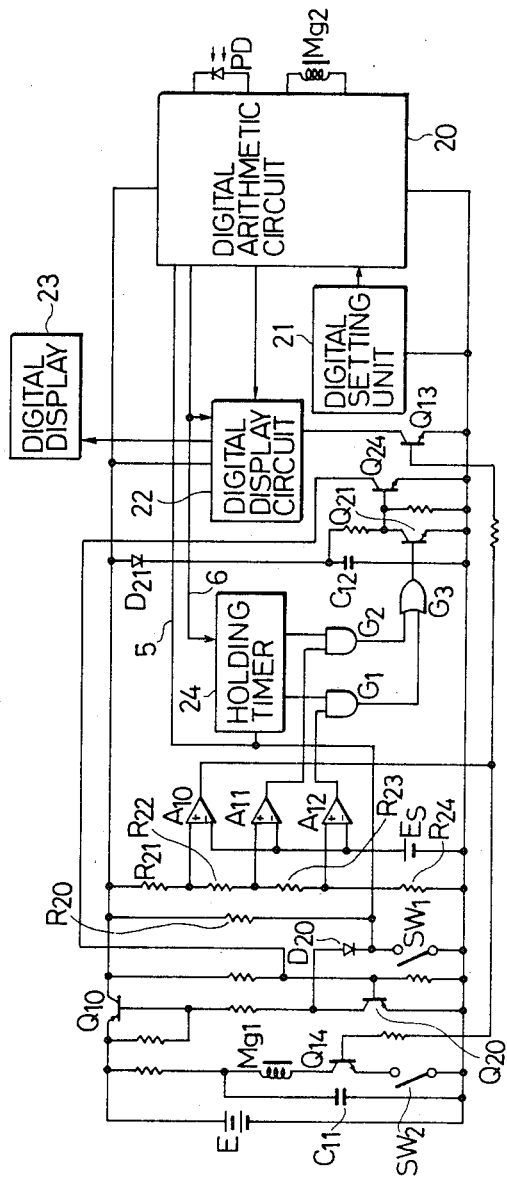
FIG. 5 is a circuit diagram of a third embodiment of power supply control circuit according to the present invention.

FIG. 5 shows a third embodiment in which the holding time control is processed in a digital manner to obtain a holding time which changes in a step manner as the battery voltage varies. Those elements in this embodiment which are functionally the same as those of FIG. 3 are identified by the same reference characters. Digital aritmetic circuit 20 analog-digital converts the brightness information of a shooting-subject detected through photodiode PD and conducts a digital calculation for proper exposure by processing the converted digital brightness information, film speed, aperture value and other exposure parameters set by digital setting circuit 21. The calculation result is transferred to digital display circuit 22. When transistor $Q_{13}$ is in its ON state, the calculation result is displayed in a predetermined mode on digital display 23. Digital arithmetic circuit 20 includes an oscillator circuit of a predetermined frequency. This oscillator circuit generates a clock pulse sequence required to conduct digital arithmetic calculation in circuit 20 and also provides, through clock line 6, display circuit 22 and power supply holding timer 24 with another clock pulse sequence synchronized with the former clock pulse sequence. Timer 24 can be constructed by conventional digital counter technology. When transistor $Q_{10}$ is placed in its ON state, timer 24 receives the clock pulses forwarded from the oscillator circuit in digital arithmetic circuit 20. At the time when power switch $SW_1$ is turned from its closed condition into an open condition, timer 24 starts the count and provides gates $G_1$ and $G_2$ with timing signals each of which has a transition from a high level to a low level at a different time from each other. The working is as follows.

When battery E has a sufficient voltage, the closure of power switch $SW_1$ actuates the positive feedback circuit consisting of transistors $Q_{10}$ and $Q_{20}$ which effect a self-holding function so that the arithmetic circuit is supplied with power. Herein, the sufficient voltage means that anyone of three step-like voltages $V_{A10}$, $V_{A11}$ and $V_{A12}$ applied to non-inverting input+ of comparators $A_{10}$, $A_{11}$ and $A_{12}$ is higher than reference voltage $V_{ES}$. In this situation, all the outputs of comparators $A_{10}$, $A_{11}$ and $A_{12}$ are in a high level. Accordingly, the output of comparator $A_{10}$ turns transistor $Q_{13}$ on. Display circuit 22 operates so that display 23 may display the control value. And also, the output of comparator $A_{10}$ places transistor $Q_{14}$ in a condition where the charge on capacitor $C_{11}$ is discharged through release magnet $Mg_1$ if release switch $SW_2$ is closed so that the release operation in a camera may be possible. While power switch $SW_1$ is closed, a low level signal applied through line 5 to holding timer 24 puts timer 24 into a reset condition where timer 24 can not operate. At this time, the output transmitted from timer 24 to AND gates $G_1$ and $G_2$ is a high level. Accordingly, AND gates $G_1$ and $G_2$ produce high level outputs and in turn the output of OR gate $G_3$ is a high level. Diode $D_{21}$, capacitor $C_{12}$, resistors and transistors $Q_{21}$ and $Q_{24}$ constitute a reset circuit for power supply holding. The high level output of OR gate $G_3$ places transistor $Q_{21}$ in its ON state which turns transistor $Q_{24}$ into OFF state. Thus, the power supply holding operation in transistors $Q_{10}$ and $Q_{20}$ is not affected. When power switch $SW_1$ is opened, timer 24 receives a high level signal through reverse current blocking diode $D_{20}$ and pull-up resistor $R_{20}$ and starts timing operation by counting clock pulses forwarded from digital arithmetic circuit 20. Te signal applied to gates $G_1$ and $G_2$ from timer 24 still remains high and the time required to change from a high level to a low level is longer in the signal applied to gate $G_1$ than in the signal applied to gate $G_2$. Accordingly, as the signal applied to gate $G_1$ from timer 24 goes low, the output of OR gate $G_3$ goes low and transistor $Q_{21}$ is turned off. The accumulated charge of capacitor $C_{12}$ in the reset circuit keeps transistor $Q_{24}$ in its ON state for a predetermined time. Transistor $Q_{24}$ in its ON state turns off transistor $Q_{20}$ of the power supply holding circuit so that the positive feedback is cleared. Thus, transistor $Q_{10}$ is securely turned off and the power supply is terminated. While the shutter is working after the camera has been actuated by the closure of switch $SW_2$, an exposure operation signal of low level is transmitted from digital arithmetic circuit 20 through line 5 to timer 24. As long as this signal is transmitted, timer 24 does not start the time counting operation even if switch $SW_1$ is opened. And also, since the ON condition of transistor $Q_{10}$ is held through diode $D_{20}$ and line 5 without regard to the situation of switch $SW_1$ and transistor $Q_{20}$, the power supply can not terminate while the shutter is being opened and the shutter control can not be disturbed. When the exposure is completed by the closure of the shutter, the exposure operation signal on line 5 becomes a high level and then timer 24 starts its operation. The power supply terminates after a corresponding time has elapsed. As a result of the battery voltage drop, when the relation of $V_{A12} < V_{ES} < V_{11}$ appears, the output of comparator $A_{12}$ only is in a low level. Thus the output of gate $G_1$ is a low level. The power supply holding time is controlled by a shorter time signal transmitted to the gates from timer 24, that is the output of gate $G_2$, in the same manner as the above. A user can learn from the shorter power supply holding time that battery consumption is developing.

As the battery voltage further goes down and falls into the relation of $V_{A11} < V_{ES} < V_{A10}$, comparator $A_{12}$ and $A_{11}$ produce a low level output and comparator $A_{10}$ a high level output. When power switch $SW_1$ is closed in this situation, the outputs of gates $G_1$ and $G_2$ become low by receiving the outputs of comparators $A_{11}$ and $A_{12}$. Since transistor $Q_{21}$ is in its OFF state and transistor $Q_{24}$ in its ON state, transistor $Q_{20}$ of the power supply holding circuit is turned off. Accordingly, the positive feedback does not function and thus the holding time becomes zero. That is, as power switch $SW_1$ is opened, the display immediately goes out. From this fact, the user can find that the battery will be used up to the extent of an unusable condition soon.

Where the battery comsumption has developed still further so that the battery voltage falls below a lower limit value capable of ensuring the proper exposure control, that is $V_{A10} < V_{ES}$, upon the closure of power switch $SW_1$ the positive feedback does not function because all the outputs of comparators $A_{10}$, $A_{11}$ and $A_{12}$ are low, though transistor $Q_{10}$ is turned on. Accordingly, the power supply holding time is zero. Transistor $Q_{13}$ is turned off because comparator $A_{10}$ produces a low level output, and thus the display remains unlighted. Even if release switch $SW_2$ is erroneously closed, the photographing sequence will not start because the release operation is locked, that is, transistor $Q_{14}$ can not be turned on. The user will notice that the battery has been used up to an unusable condition.

Figure 6:
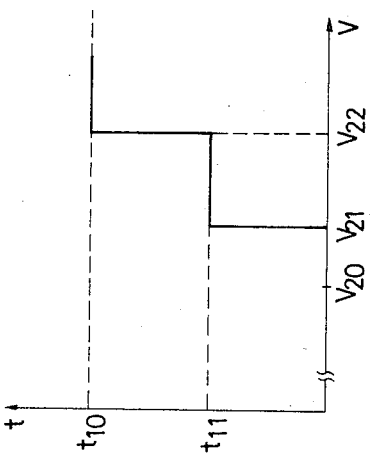
FIG. 6 is a plot of power supply holding time versus battery voltage in the circuit of FIG. 5.

FIG. 6 shows the relation between battery voltage V and holding time t after power switch $SW_1$ is opened in the circuit of FIG. 5, where $V_{22}$ is a battery voltage at $V_{A12} < V_{ES} < V_{A11}$, $V_{21}$ a battery voltage at $V_{A11} < V_{ES} < V_{A10}$ and $V_{20}$ a battery voltage at $V_{A10} < V_{ES}$. The line of FIG. 6 shows that the holding time is set as $t_{10}$ in the battery voltage range of $V > V_{22}$, $t_{11}$ shorter than $t_{10}$ in the range of $V_{21} < V < V_{22}$ and zero in the range of $V_{20} < V < V_{21}$. And in the battery voltage range of $V < V_{20}$, shutter release locking is in effect.

In the power supply control circuit according to the invention, the waste of a battery can be relieved because the power supply holding time is made shorter as battery consumption develops.

The present invention is not limited to the embodiment shown, but can be modified without deviating from the scope of the present invention.

I claim:

1. A power supply control circuit for controlling supply of power from a battery to a battery-operated circuit, the control circuit comprising:

manually operable power switch means;
   means responsive to manual operation of said power switch means for supplying power from said battery to said battery-operated circuit as long as said power switch means is manually operated;
   a time-measuring circuit having means for starting time-measuring upon termination of manual operation of said switch means and producing a time-measuring signal for a predetermined time period that begins with the starting of time-measuring;
   a holding circuit having means for supplying power from said battery to said battery-operated circuit while said time-measuring signal is being produced; and
   a detection circuit for detecting the battery voltage and reducing said predetermined time period as the battery voltage goes down.

2. The power supply control circuit as defined in claim 1, wherein said detection circuit has means that produces a first detection signal when the battery voltage is higher than a predetermined value and a second detection signal when the battery voltage is lower than said predetermined value.

3. The power supply control circuit as defined in claim 2, wherein said time-measuring circuit has means operative in response to said first detection signal to set said predetermined time period to a first time period and in response to said second detection signal to set said predetermined time period to a second time period markedly shorter than said first time period.

4. The power supply control circuit as defined in claim 3, wherein said second time period is substantially zero.

5. The power supply control circuit as defined in claim 2, wherein said means that produces said first detection signal continuously changes said first detection signal in response to the fall of the battery voltage, and wherein said time-measuring circuit has means that continuously reduces its said predetermined time period as said first detection signal changes.

6. The power supply control circuit as defined in claim 1, wherein said detection circuit has means that prevents the supply of power from said battery to said battery-operated circuit when the battery voltage is below a lower limit value irrespective of the manual operation of said switch means, the lower limit value being a voltage at which said battery-operated circuit cannot work in a normal manner.

7. The power supply control circuit as defined in claim 6, wherein said battery-operated circuit includes display means which operates as long as power is supplied.

* * * * *